US006861865B1

(12) United States Patent
Carlson

(10) Patent No.: US 6,861,865 B1
(45) Date of Patent: Mar. 1, 2005

(54) APPARATUS AND METHOD FOR REPAIRING LOGIC BLOCKS

(75) Inventor: David A. Carlson, Haslet, TX (US)

(73) Assignee: Cavium Networks, Santa Clara, CA (US)

(*) Notice: Subject to any disclaimer, the term of this patent is extended or adjusted under 35 U.S.C. 154(b) by 0 days.

(21) Appl. No.: 10/387,151

(22) Filed: Mar. 11, 2003

(51) Int. Cl.$^7$ ............................................ H03K 19/003
(52) U.S. Cl. ............................ 326/10; 326/41; 326/38; 326/39; 326/40
(58) Field of Search ........................ 326/10–14, 38–41

(56) References Cited

U.S. PATENT DOCUMENTS

| | | | | |
|---|---|---|---|---|
| 5,459,342 A | * | 10/1995 | Nogami et al. ............. 257/209 |
| 5,498,975 A | * | 3/1996 | Cliff et al. ..................... 326/10 |
| 6,034,536 A | * | 3/2000 | McClintock et al. ......... 326/10 |
| 6,201,404 B1 | * | 3/2001 | Reddy et al. ................. 326/10 |
| 6,526,559 B2 | * | 2/2003 | Schiefele et al. ............. 716/16 |
| 6,545,501 B1 | * | 4/2003 | Bailis et al. .................. 326/10 |

* cited by examiner

Primary Examiner—Vibol Tan
(74) Attorney, Agent, or Firm—Blakely, Sokoloff, Taylor & Zafman, LLP

(57) ABSTRACT

An apparatus is described comprising: a set of logic blocks configured to perform designated data processing functions; a set of redundant logic blocks also configured to perform the designated data processing functions; and a logic block selector module to replace one or more of the set of logic blocks with one or more of the set of redundant logic blocks according to specified logic block replacement conditions.

31 Claims, 8 Drawing Sheets

US 6,861,865 B1

APPARATUS AND METHOD FOR REPAIRING LOGIC BLOCKS

BACKGROUND

1. Field of the Invention

This invention relates generally to the field of integrated circuits. More particularly, the invention relates to an improved architecture for detecting and repairing logic blocks within integrated circuits.

2. Description of the Related Art

Random access memory ("RAM") devices are typically fabricated with several redundant columns or rows of memory so that, in the event that a memory cell within the memory device fails, the redundant row or column may be used in place of the row or column with the damaged memory cell. This concept will be described with respect to FIG. 1, which shows a representative portion of a memory device 100 with a damaged memory cell 120. Within the memory device 100, adjacent pairs of memory columns are provided as inputs to each of a plurality of multiplexers 140–144. For example, adjacent memory columns 121 and 122 are each provided as inputs to multiplexer 142 which couples one of the two memory columns 121, 122 to its output based on selection signals 130.

In operation, the memory device 100 is tested following fabrication. Typically, during testing, a known test pattern is shifted through each of the memory cells to determine whether the cells are functional. If a memory device with damaged cells is determined to be repairable (i.e., based on the number and/or location of the damaged memory cells) the memory columns on which the damaged memory cells are located are disabled. In the example shown in FIG. 1, based on the location of the damaged memory cells, one or more fuses within a fuse bank 105 are blown. A decoder 110 decodes the output of the fuse bank to identify and bypass the memory column 121 with the damaged memory cell 120. A single fuse within the fuse bank 105 represents either a binary '1' or a '0' depending on whether it is blown. Thus, with N fuses configured within the fuse bank 105, $2^N$ memory columns may be individually identified by the decoder 110. Although the select signal 130 from the decoder 110 is illustrated as a single line in FIG. 1 for simplicity, the decoder output will actually include a separate binary control line for supplying a select signal to each of the multiplexers.

In the specific example illustrated in FIG. 1, in response to the blown fuses, the decoder 110 generates a select signal of '0' for multiplexer 142, causing the multiplexer 142 to select memory column 122 in lieu of the damaged memory column 121. The decoder 110 also provides binary select signals of '0' to all multiplexers 143–144 to the right of multiplexer 142, causing these multiplexers 143–144 to select the rightmost memory columns at each of their respective inputs. Conversely, the decoder 110 provides a binary select signal of '1' to each of the multiplexers 140–141 to the left of multiplexer 142, causing these multiplexers 140–141 to select the leftmost memory columns at each of their respective inputs. Thus, the end result is that the memory column 122 with the damaged memory cell 120 is effectively removed from the memory device 100.

SUMMARY

An apparatus is described comprising: a set of logic blocks configured to perform designated data processing functions; a set of redundant logic blocks also configured to perform the designated data processing functions; and a logic block selector module to replace one or more of the set of logic blocks with one or more of the set of redundant logic blocks according to specified logic block replacement conditions.

BRIEF DESCRIPTION OF THE DRAWINGS

A better understanding of the present invention can be obtained from the following detailed description in conjunction with the following drawings, in which.

DETAILED DESCRIPTION

In the following description, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form to avoid obscuring the underlying principles of the present invention.

Embodiments of the invention described below employ different techniques for repairing an integrated circuit having multiple logic blocks. After the integrated circuit is repaired with these techniques, the functionality of the integrated circuit is indistinguishable from integrated circuits which were not repaired following fabrication. For example, even when additional tests are run on the repaired integrated circuit, the results of the tests are consistent across repaired logic blocks and logic blocks which did not require repair (i.e., the repaired integrated circuit is pattern invariant for testing purposes).

Figure 1:
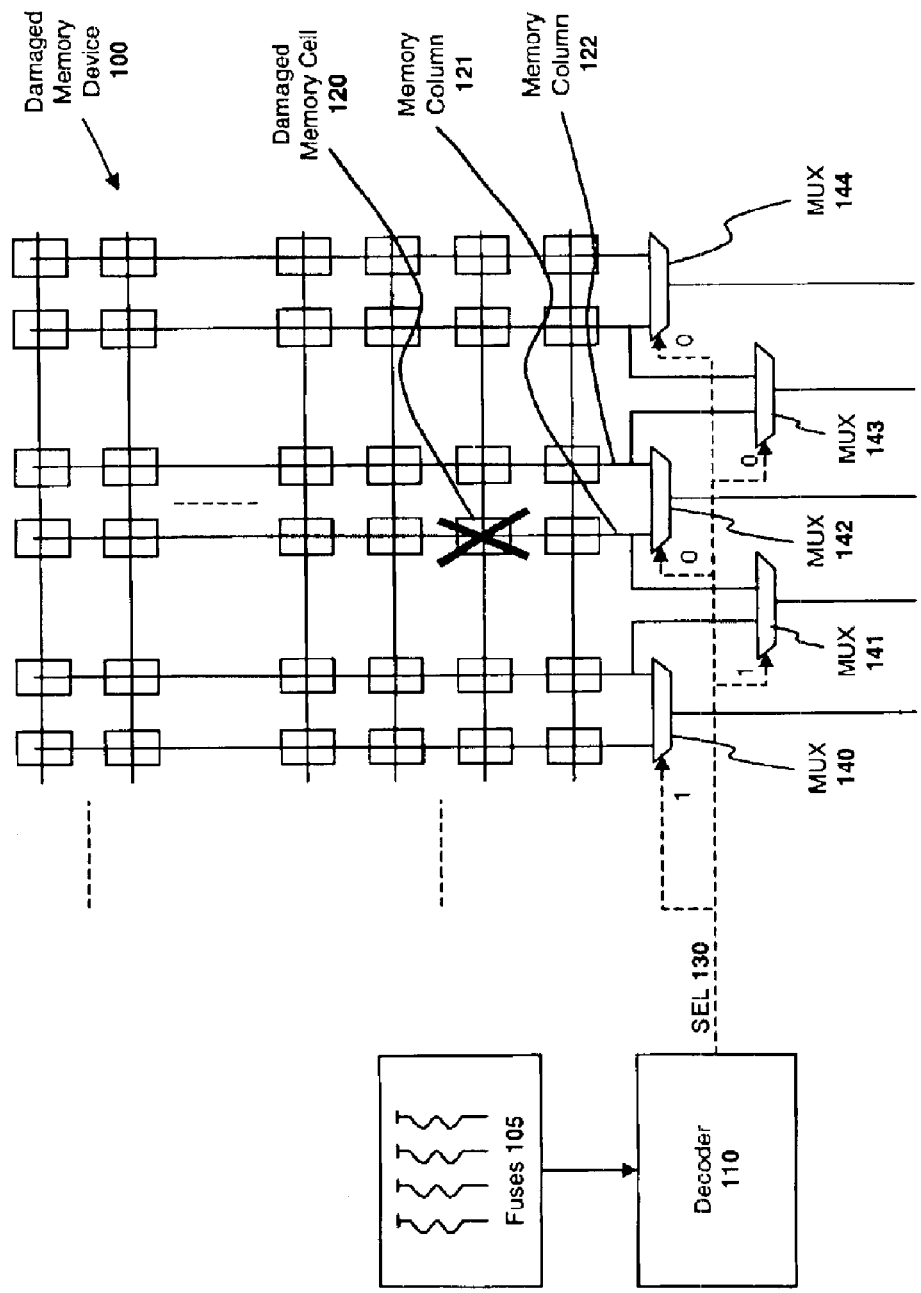
FIG. 1 illustrates prior art techniques for repairing a damaged memory device.
Figure 2A:
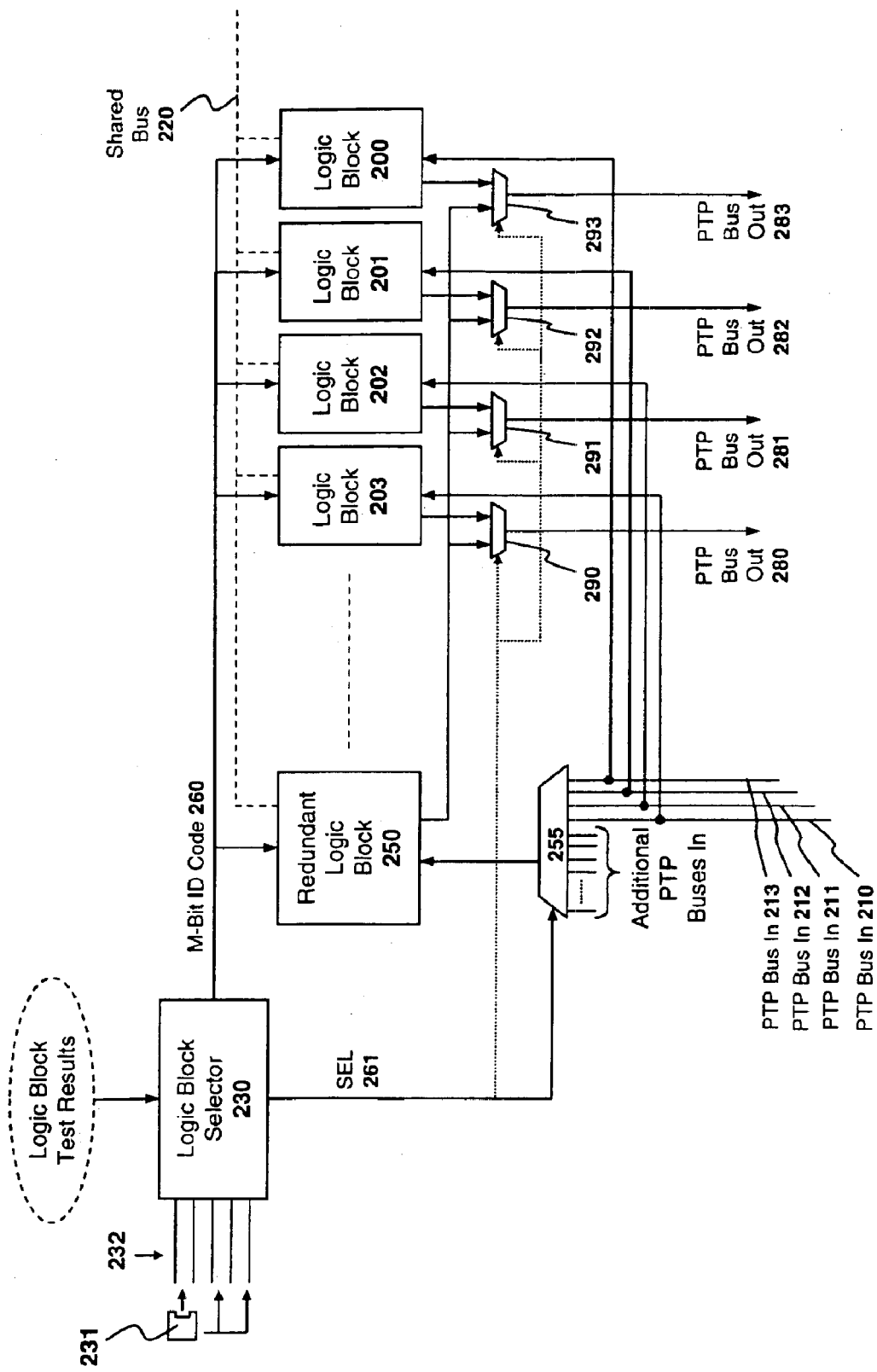
FIG. 2a illustrates one embodiment of an apparatus for repairing a circuit with damaged logic blocks.

In one embodiment of the invention, illustrated in FIG. 2a, a first set of logic blocks 200–203 and a second set of "redundant" logic blocks 250 are produced on the same chip during fabrication. For the sake of clarity, only four logic blocks 200–203 and a single redundant logic block 250 are illustrated in FIG. 2a. It will be appreciated, however, that any number of additional logic blocks within the first set and/or the set of redundant logic blocks may be employed while still complying with the underlying principles of the invention. In fact, depending on the implementation, it may be beneficial to have more than a single redundant logic block 250.

In one embodiment, a hard-coded ID code or address (hereinafter referred to generally as an "ID code") is permanently assigned to each of the first set of logic blocks 200–203 (e.g., during IC fabrication). By contrast, the ID code 260 of the redundant logic block 250 is programmed by a logic block selector module 230. In one embodiment, the logic block selector module 230 includes a bank of fuses which are blown in a particular pattern to generate the redundant logic block ID code 260. As mentioned above, each fuse represents either a 0 or a 1 depending one whether or not it is blown. Accordingly, N fuses may be used to address $2^N$ individual logic blocks.

However, various alternatives to a bank of fuses may be employed. For example, in one embodiment the logic block selector module 230 includes a non-volatile, programmable memory such as an Electrically Erasable Programmable Read Only Memory ("EEPROM") or Flash memory for storing the ID code 260. A volatile memory such as a random access memory ("RAM") may also be used (e.g., and refreshed with the correct ID code(s) each time the IC is initialized). Alternatively, the logic block selector module 230 may include a series of jumpers 231 or pins 232 external to the chip on which the various logic blocks reside. The ID code may then be assigned to the redundant logic block 250 by physically modifying the pins 232 and/or jumpers 231. Various additional techniques may be employed for generating and storing the ID code 260 while still complying with the underlying principles of the invention.

In operation, the series of logic blocks 200–203 are tested following fabrication to determine which, if any, are damaged. Various different IC testing tools/techniques may be employed. In one embodiment, each logic block is individually enabled and tested using automatic test pattern generation ("ATPG") testing techniques. However, the underlying principles of the invention are not limited to any particular type of IC testing. In one embodiment, each of the logic blocks 200–203 and the redundant logic block 250 are logically identical and, as a result, produce the same test pattern results if functioning correctly.

During ATPG testing, a serial chain of zeros and ones are shifted through each of the individual logic blocks. If the output from each logic block is what is expected, then the logic block is considered undamaged. If a different output is read out, then the logic block is damaged and must be repaired as described herein. In one embodiment, a serial input pin and a serial output pin is provided for each individual logic block (e.g., the chain of zeros and ones is transmitted through the serial input pin and read out through the serial output pin). Alternatively, in one embodiment, a single serial input is provided for each of the logic blocks, but each logic block is provided with its own serial output. The underlying principles of the invention remain the same regardless of how the serial chain of zeros and ones is provided to each logic block.

Figure 2B:
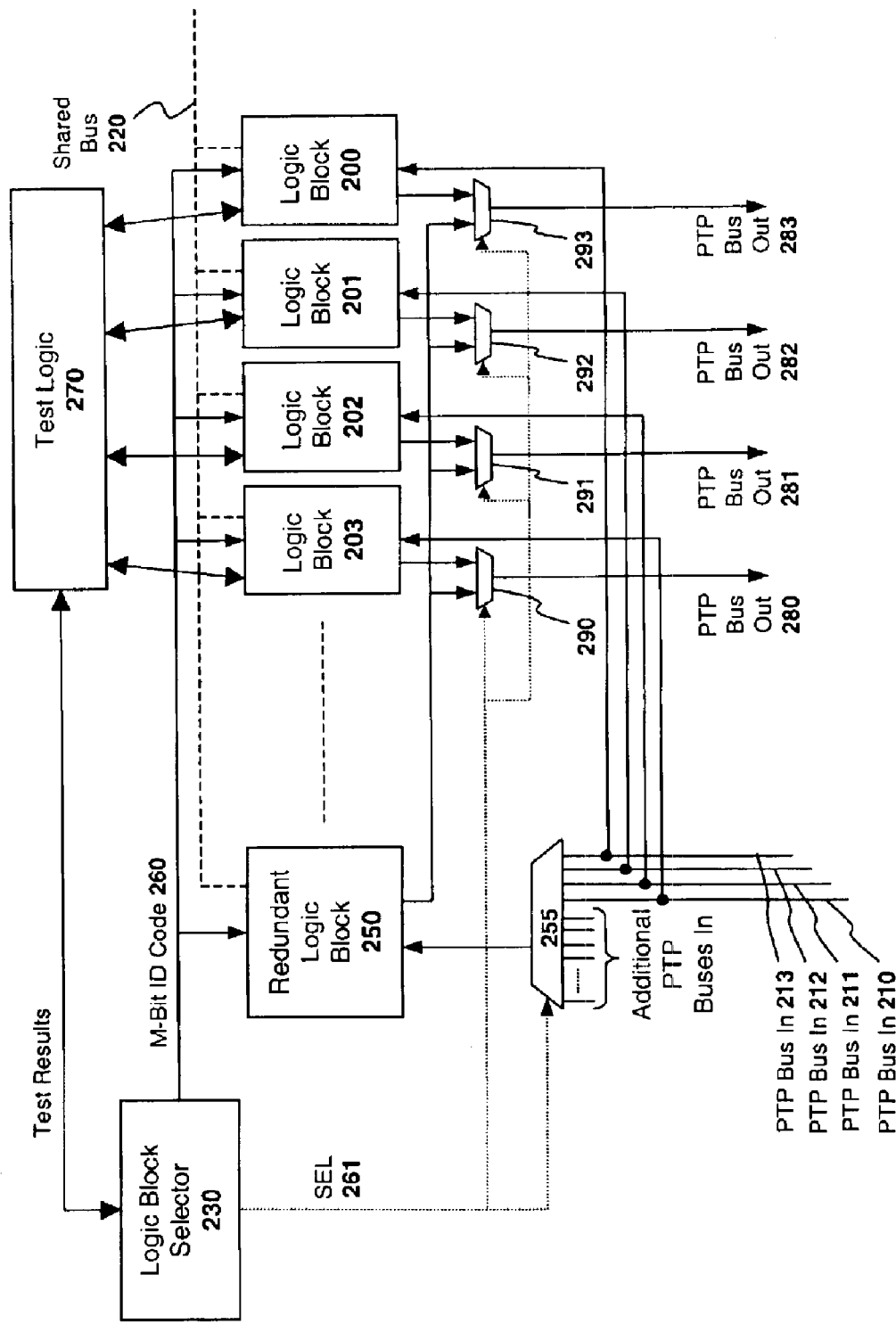
FIG. 2b illustrates an embodiment of an apparatus for repairing a circuit with damaged logic blocks which includes embedded test logic.

Testing of the logic blocks 200–203 may be performed manually (e.g., by communicatively coupling the IC to test equipment following fabrication) or may be automatic. For example, as illustrated in FIG. 2b, in one embodiment, test logic 270 embedded on the IC on which the logic blocks 200–203 reside automatically tests each of the logic blocks 200–203 upon initialization of the IC. The test logic 270 then provides the results of the tests to the logic block selector module 230, which generates an ID code 260 based on the test results.

The tests may indicate that certain logic blocks 200–203 are not functioning correctly. If so, in one embodiment of the invention, based on the test results, the logic block selector module 230 generates same ID code 260 as that used by the damaged logic block, thereby effectively replacing the damaged logic block with the redundant logic block 250.

Figure 3:
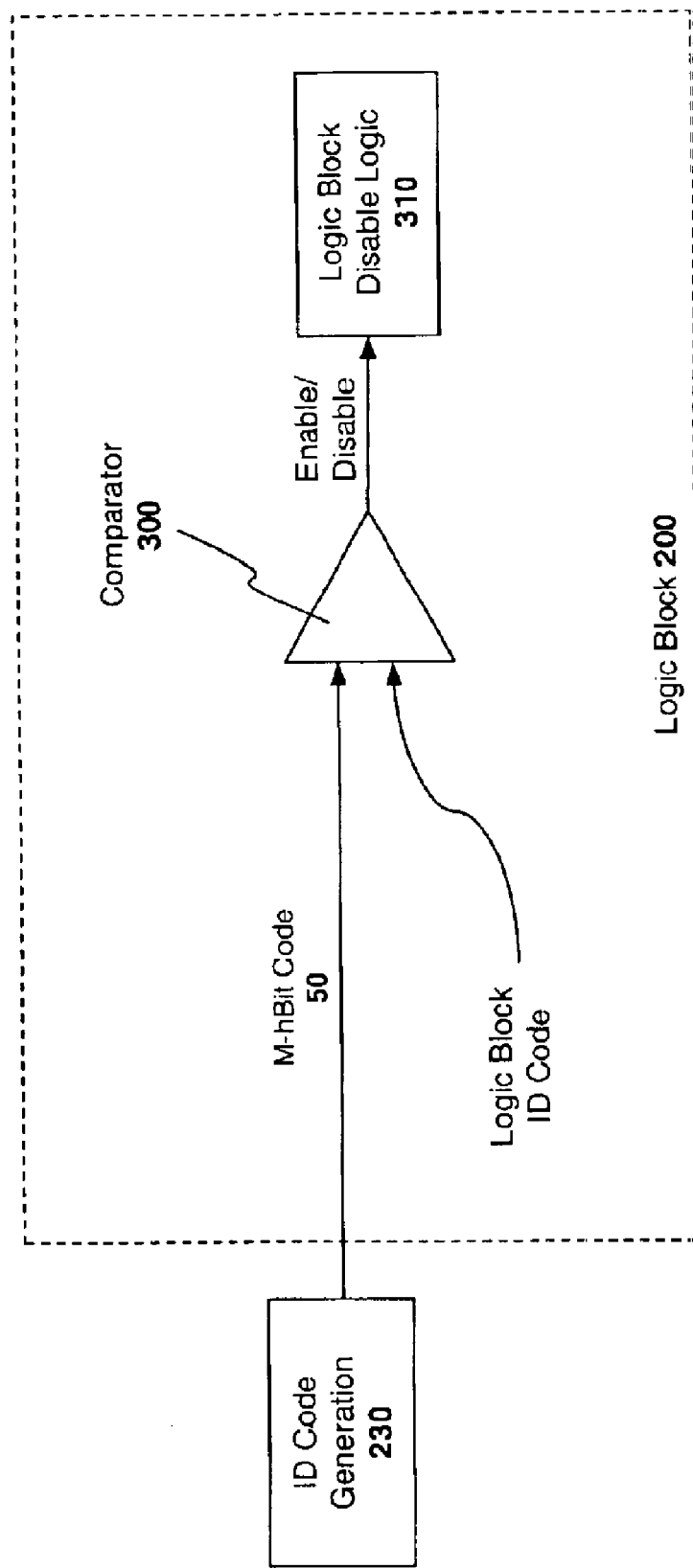
FIG. 3 illustrates comparison logic within a logic block according to one embodiment of the invention.

In addition, as illustrated in FIG. 3, each logic block 200 includes disabling logic 310 for disabling the logic block. In one embodiment, a comparator 300 compares the ID code generated by the logic block selector module 230 with the ID code of the logic block 200. If the two codes match, then the comparator 300 generates a disable signal (e.g., a '1' or a '0'). In response to the disable signal, logic block disable logic 310 disables the damaged logic block 200. In one embodiment, the disable logic 310 disables the logic block 200 by decoupling the clock input to the logic block 300.

As illustrated in FIG. 2a, in one embodiment, each of the logic blocks 200–203, 250 communicates over both a shared bus 220 and a point-to-point bus with a series of input lines 210–213 and a series of output lines 280–283. In general, the logic blocks 200–203, 250 use the shared bus 220 to transmit and receive data and use the point-to-point buses 210–213, 280–283 to transmit and receive control signals. For example, when a particular logic block needs to transmit data on the shared bus 220 it transmits a bus request signal over its point-to-point bus output line (e.g., line 280 for logic block 203) to request access to the shared bus 220. The logic block is then notified of the availability of the shared bus 220 over a point-to-point input line (e.g., line 210 for logic block 203) based on a particular bus arbitration scheme.

In one embodiment, when assigning the redundant logic block 250 the ID code 260 of the damaged logic block, the point-to-point input and output lines of the damaged logic block are coupled to the redundant logic block 250. As shown in FIG. 2a, the logic block selector module 230 applies the ID code 260 as a select signal 261 to a multiplexer 255 which, in response, couples the point-to-point bus input line of the damaged logic block to the point-to-point input of the redundant logic block 250. In addition, the select signal is provided to a series of multiplexers 290–293. In response, the multiplexer associated with the damaged logic block (e.g., multiplexer 290 for logic block 203) couples the point-to-point output of the redundant logic block 250 to the point-to-point bus output line (e.g., line 280). As a result, the redundant logic block 250 effectively replaces damaged logic block within the IC.

After the circuit has been repaired using the techniques described above, an additional "focus pattern" test is run on the circuit. Unlike an ATPG test, a focus pattern test is designed specifically for the integrated circuit being tested (e.g., by executing functions designed to run on the integrated circuit). If the damaged logic block has been successfully replaced by the redundant logic block 250, then the results of any tests following the replacement will be the same for both repaired circuits and circuits which did not require repair (i.e., the results of the test are "pattern invariant" for all circuits with the same total number of enabled logic blocks).

Figure 4:
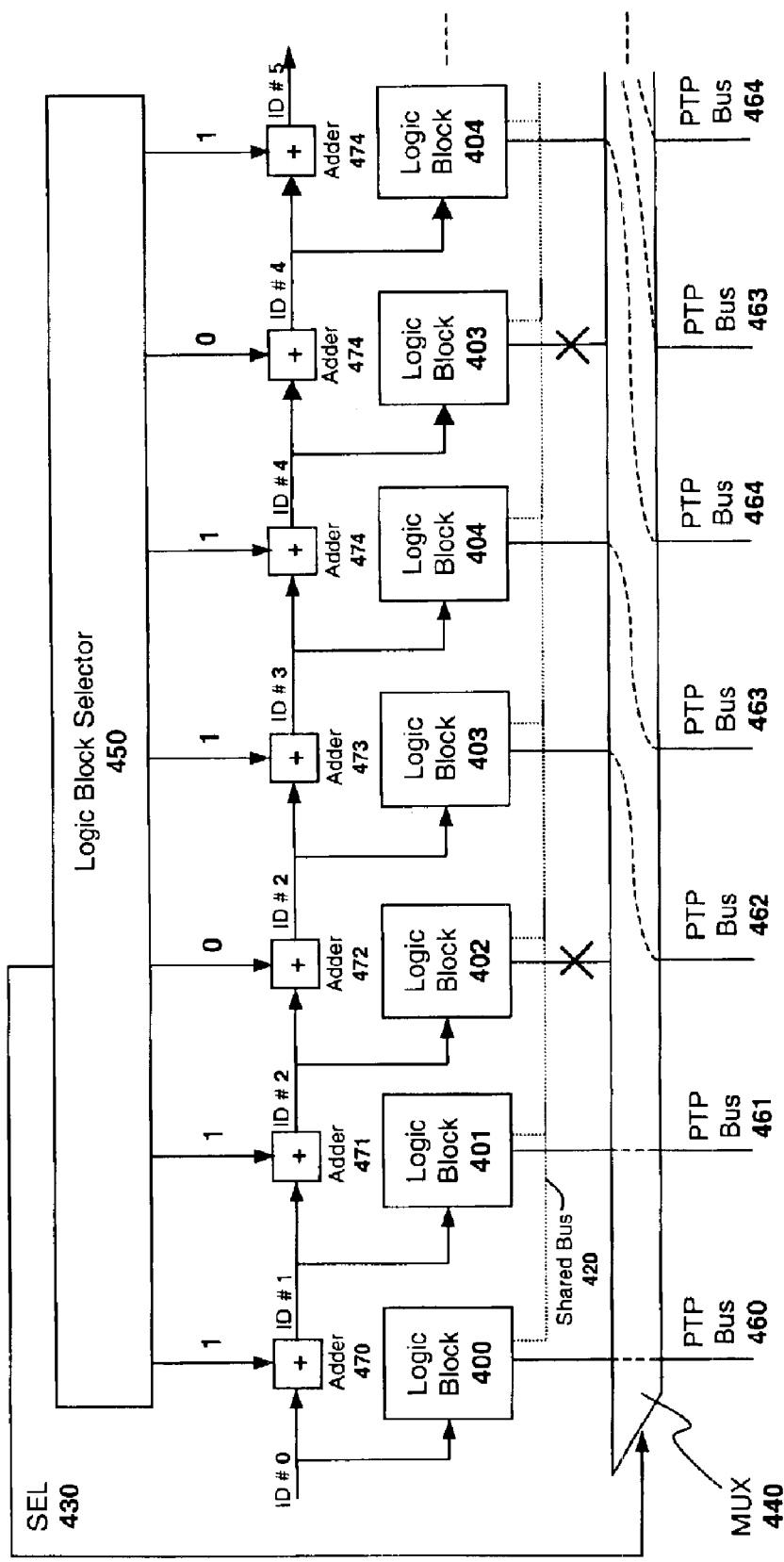
FIG. 4 illustrates one embodiment of an apparatus for repairing a circuit which uses programmable ID codes for each logic block.

FIG. 4 illustrates another embodiment of the invention in which the ID codes for all of the logic blocks 400–404 are programmable. As in the prior embodiments described above, testing is initially performed to determine which, if any, of the logic blocks 400–404 are damaged. In the specific example shown in FIG. 4, logic block 402 is damaged. A logic block selector 250 generates a series of binary output values which are applied as inputs to a plurality of adders 470–474. Each of the binary values is associated with a particular logic block. In one embodiment, the logic block selector 450 will generate a binary '0' for any damaged blocks and a binary '1' for undamaged logic blocks.

The first adder 470 receives an ID code value of '0' at one input and a binary value from the logic block selector 450 associated with the first logic block 400 at the second input. The ID code value of '0' is programmed in the first logic block 400. Because the first logic block 400 is not damaged, the logic block selector 450 generates a value of '1' for that logic block. As a result, the output of the adder 470 is an ID code value of '1' (i.e., 0+1) which is automatically programmed as the ID code for the next logic block 401 in sequence.

The second adder 471 receives the ID code value of '1' at one input and a binary value from the logic block selector 450 associated with the second logic block 401 at the other input. Because the second logic block 401 is not damaged, the logic block selector 450 generates a value of '1' for that logic block. As a result, the output of the second adder 471 is an ID code value of '2' (i.e., I+1) which is applied as the ID code for the third logic block 402 in sequence.

The third logic block 402 is damaged. Consequently, the logic block selector generates a '0,' as illustrated, and an ID code value of '2' is produced by the third adder 472 (i.e., 2+0). The ID code value of 2 is then applied to the fourth logic block 403 in sequence. Because the fourth and fifth logic blocks are not damaged, the logic block selector 450 generates a binary '1' for each of these logic blocks and the ID codes output by next two adders 473 and 474 increases sequentially (i.e., ID code #4 and ID code # 5, respectively).

The result of the foregoing operations is that both the damaged logic block 402 and the undamaged logic block 403 are assigned the same ID code value of '2.' However, in one embodiment, the damaged logic block 402 is disabled and removed from the system. Specifically, as illustrated in FIG. 4, the point-to-point buses for each of the logic blocks 400–404 are provided to a multiplexer 440. Based on a select signal 430 generated by the logic block selector 450, the multiplexer 440 couples the logic blocks 400–404 to a plurality of point-to-point bus lines 460–464. In one embodiment, the select signal 430 is comprised of the binary values associated with each of the logic blocks 400–404.

In the specific example shown in FIG. 4, the logic block 400 is coupled to point-to-point bus 460 and the logic block 401 is coupled to point-to-point bus 461. However, because logic block 402 is damaged, it is not coupled to a point-to-point bus. The next undamaged logic block 403 in sequence is coupled to the next point-to-point bus 462 in sequence (and so on) until all of the undamaged logic blocks are coupled to point-to-point buses.

In addition, in one embodiment, each logic block includes disable logic 310 such as that illustrated in FIG. 3. Rather than using a comparator 300, however, in one embodiment, each bit generated by the logic block selector 450 is provided directly to its associated logic block (e.g., a binary '0' is provided to logic block 402). In response, the disable logic 310 disables the damaged logic block 402 using one or more of the mechanisms described above (e.g., by decoupling the clock input to the logic block 402). Of course, a comparator 300 could also be used while still complying with the underlying principles of the invention (i.e., to compare the ID code assigned to the logic block with the ID code output from the next adder in sequence).

Figure 5A:
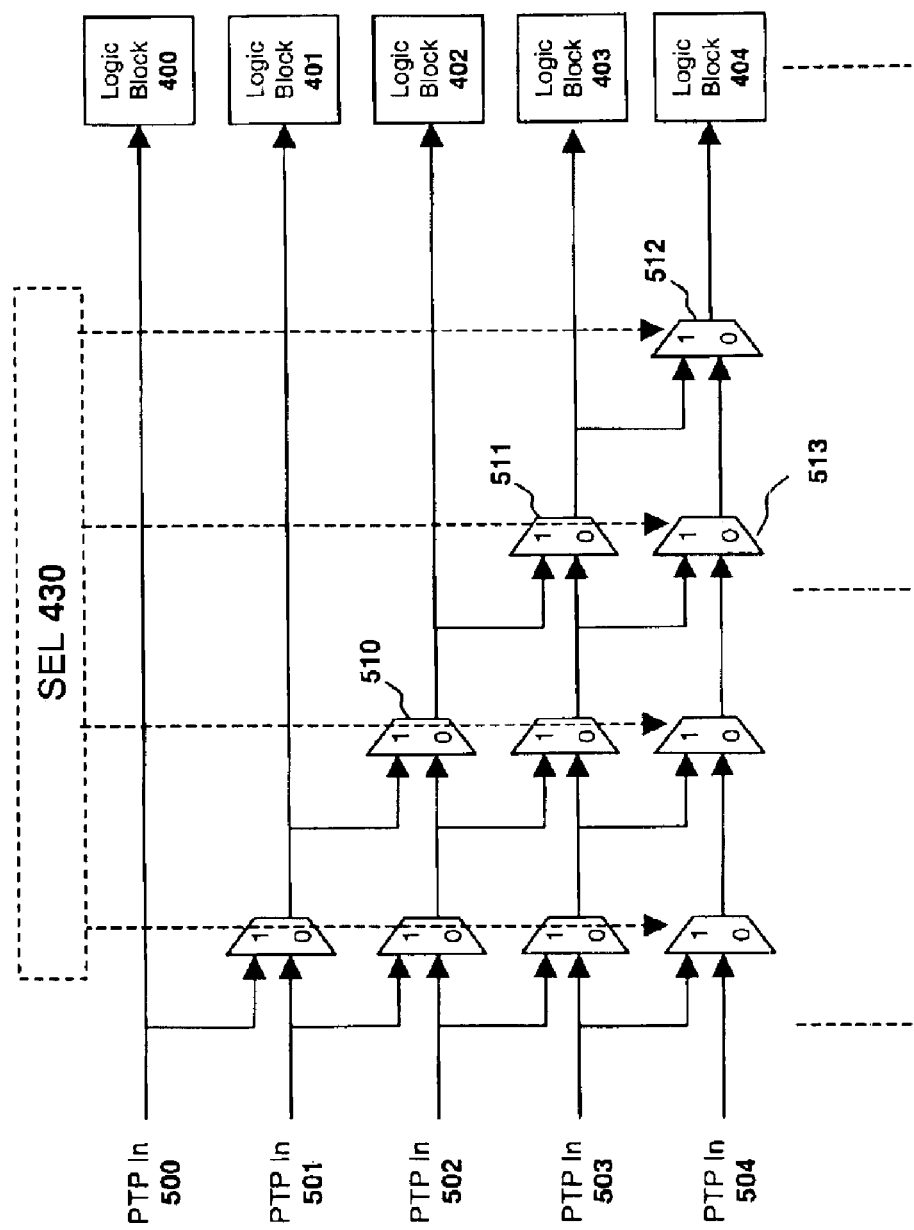
FIGS. 5a–b illustrate portions of a collapsing multiplexer employed in one embodiment of the invention.
Figure 5B:
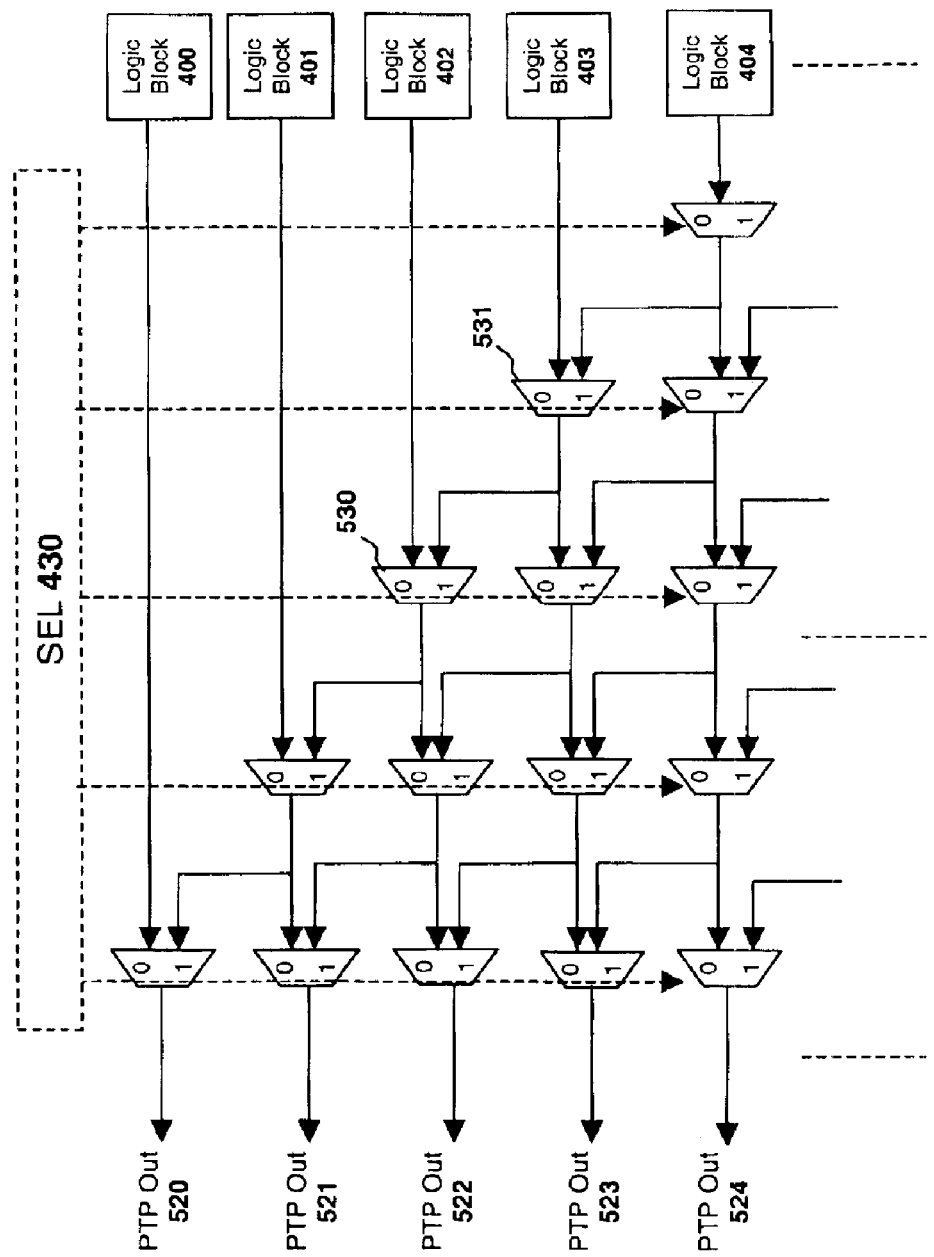

A more detailed illustration of one embodiment of the multiplexer 440 is illustrated in FIGS. 5a–b. The select signal 430 is provided to each of the multiplexers shown in FIGS. 5a–b. FIG. 5a illustrates how a series of point-to-point bus inputs 500–504 are coupled to the logic blocks 400–404 in response to the select signal 430. Similarly, FIG. 5b illustrates how a series of point-to-point bus outputs 520–524 are coupled to the logic blocks 400–404 in response to the select signal.

By way of example, if it has been determined that logic block 402 is damaged then, referring to FIG. 5a, the select signals 430 will cause multiplexer 511 to couple the output of multiplexer 510 to its own output which is provided to logic block 403. Similarly, logic block 512 will couple the output of logic block 513 to logic block 404 (and so on), so that logic block 402 is effectively bypassed. The end result will be that PTP In 500 is coupled to logic block 400, PTP In 501 is coupled to logic block 401, PTP In 502 is coupled to logic block 403, and PTP In 503 is coupled to logic block 404.

Referring now to FIG. 5b, if logic block 402 is damaged then, in response to the select signals 430, multiplexer 530 will select the output of multiplexer 531, rather than the output of logic block 402. The end result will be that logic block 400 is coupled to PTP Out 520, logic block 401 is coupled to PTP Out 521, logic block 403 is coupled to PTP Out 522, and logic block 404 is coupled to PTP Out 523.

In one embodiment, to maintain consistency across similarly-labeled parts, following testing, the same number of logic blocks are disabled for each IC with the same part number. For example, in one embodiment, each IC is fabricated with 24 logic blocks. In some of the ICs, none of the logic blocks will be damaged. As a result, these undamaged ICs may be categorized as "high end" parts and sold with all 24 logic blocks enabled. By contrast, if an IC has between 1 and 4 bad logic blocks, for example, then it may be categorized and sold as a relatively lower-end part with only 20 logic blocks enabled. In other words, for ICs with less than 4 damaged blocks, some undamaged blocks may be disabled for the sake of consistency (i.e., so that each part with the same part number has exactly the same test pattern and data processing capabilities). Additional categories of ICs may be developed based on factors such as yield rate and the available market for the parts. The embodiments of the invention described above thereby provide a convenient mechanism not only for repairing ICs but also for logically differentiating ICs based on the number of logic blocks enabled on the IC.

As mentioned above, in one embodiment of the invention, each of the logic blocks is an independently addressable microprocessor for processing program code and data. In one specific implementation, the chip containing the logic blocks is a cryptographic processor with multiple cryptographic "execution units" such as the Nitrox or Nitrox 2 processors developed by Cavium Networks, Inc., of San Jose, Calif. In this context, each of the logic blocks is an independent micro-programmed "execution unit" with individual cryptographic function units capable of performing various cryptographic functions including IP Security ("IPSEC") and Secure Sockets Layer ("SSL") functions. It should be noted that the term "execution unit" is not necessarily used in the traditional sense of an execution unit within a microprocessor such as an Intel x86 microprocessor.

Figure 6:
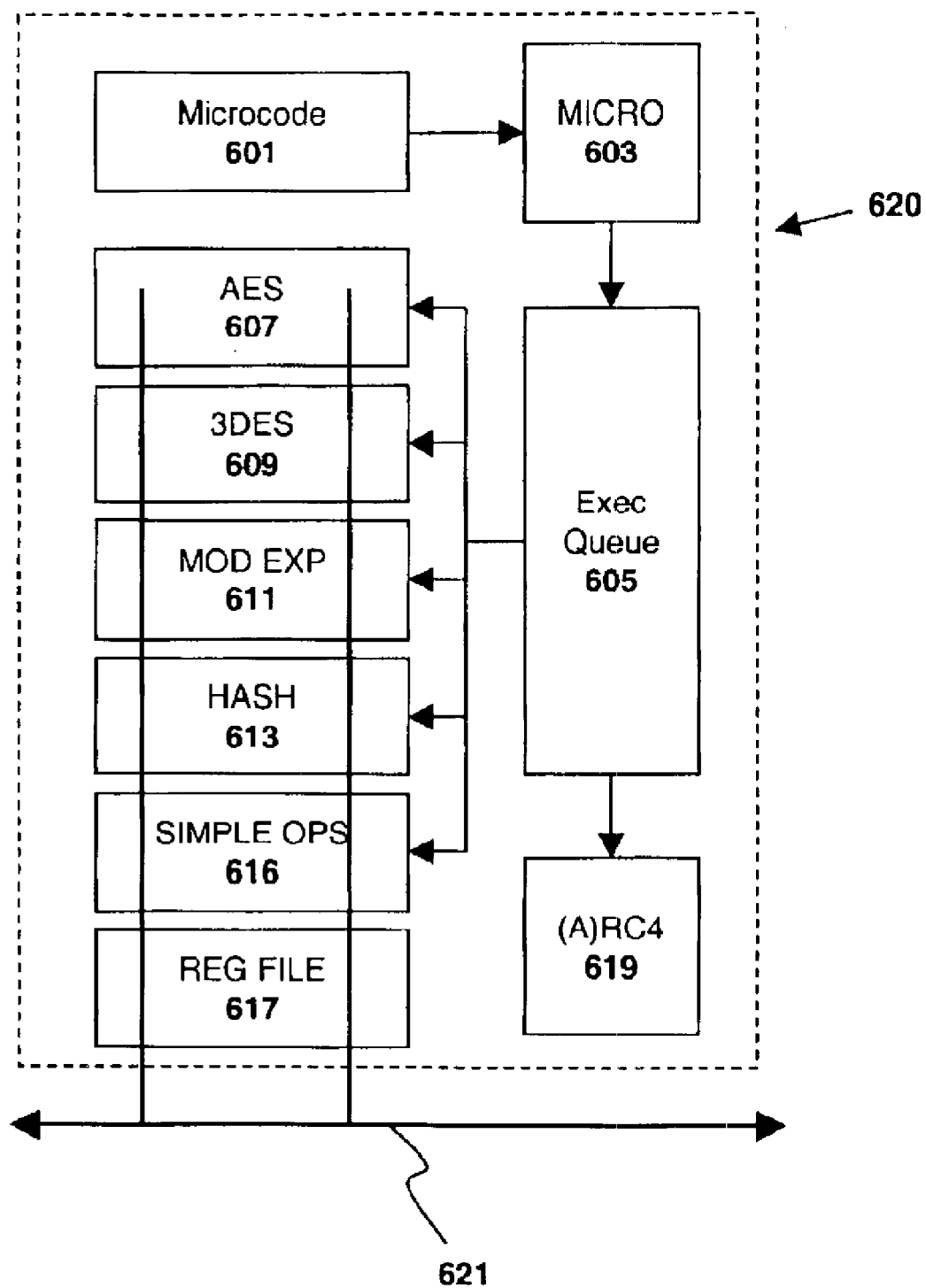
FIG. 6 illustrates one embodiment of a logic block employed within a cryptographic processor.

An exemplary cryptographic processor 620 is illustrated in FIG. 6. A microcode block 601 is coupled to a microcontroller block 603. The microcontroller block 603 is coupled to an execution queue block 605. The execution queue block 605 is coupled to a set of primitive security operation blocks including an Advanced Encryption Standard (AES) block 607, a Triple Data Encryption Standard (3DES) block 609, a modular exponentiation block 611, a hash block 613, a simple arithmetic and logic block 615, and an alleged RC4® block 619. Alternative embodiments of the invention may include additional primitive security operation blocks or fewer primitive security operation blocks. A bus 621 couples the primitive security operation blocks 607, 609, 611, 613, 619 and the register file block 617 together.

The microcode block 601 translates a security operation into one or more primitive security operations and passes the primitive security operation(s) to the microcontroller block 603. The microcontroller block 603 retrieves from the register file 617 the appropriate data for each of the primitive security operations. The primitive security operations are placed into the execution queue 605 by the microcontroller block 603. When a primitive security operation's corresponding primitive security operation block is able to perform the primitive security operation, the execution queue 605 pushes the primitive security operation to the appropriate primitive security operation block 607, 609, 611, 613, 615, or 619. Once a primitive security operation block 607, 609, 611, 613, 615, or 619 executes the primitive security operation, the primitive security operation block either passes the results to the register file 617 or onto the bus 621.

The cryptographic processor which includes the execution units may implemented in either a co-processor configuration (e.g., as a co-processor to a host network processor) or an inline configuration where the cryptographic processor is directly coupled to process data from a framer or comparable media access control ("MAC") device (e.g., via a system packet interface such as a SPI-3 or a SPI-4 interface). In the co-processor configuration, the cryptographic processor responds to security processing requests from the host network processor. By contrast, in the inline configuration, the cryptographic processor performs security operations directly on data traffic transmitted to and from the framer or other MAC device. Of course, the underlying principles of the invention remain the same regardless of the context in which the cryptographic processor is employed.

While each execution unit has its own microcode block in the embodiment illustrated in FIG. 6, alternative embodiments have one or more execution units share a single microcode block. Yet other embodiments have a central microcode block (e.g., in SRAM) whose contents a re loaded during power-up into local microcode blocks in each of the execution units. Regardless of the arrangement of the microcode block(s), in certain embodiments the microcode blocks are reprogrammable to allow for flexibility in the selection of the security operations (be they macro and/or primitive security operations) to be perform ed.

In the foregoing description, for the purposes of explanation, numerous specific details are set forth in order to provide a thorough understanding of the present invention. It will be apparent, however, to one skilled in the art that the present invention may be practiced without some of these specific details. For example, although a cryptographic processor implementation is described above, the underlying principles of the invention are not limited to this implementation. A virtually unlimited number of different logic block types may be used in accordance with the principles of the invention. Moreover, in certain instances set forth above, well-known structures and devices are shown in block diagram form to avoid obscuring the underlying principles of the present invention.

Embodiments of the invention may include various steps as set forth above. The steps may be embodied in machine-executable instructions. The instructions can be used to cause a general-purpose or special-purpose processor to perform certain steps. Alternatively, these steps may be performed by specific hardware components that contain hardwired logic for performing the steps, or by any combination of programmed computer components and custom hardware components.

Elements of the present invention may also be provided as a machine-readable medium for storing the machine-executable instructions. The machine-readable medium may include, but is not limited to, floppy diskettes, optical disks, CD-ROMs, and magneto-optical disks, ROMs, RAMs, EPROMs, EEPROMs, magnetic or optical cards, propagation media or other type of media/machine-readable medium suitable for storing electronic instructions. For example the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

It is also important to note that the apparatus and method described herein may be implemented in environments other than a physical integrated circuit ("IC"). For example, the circuitry may be incorporated into a format or machine-readable medium for use within a software tool for designing a semiconductor IC. Examples of such formats and/or media include computer readable media having a VHSIC Hardware Description Language ("VHDL") description, a Register Transfer Level ("RTL") netlist, and/or a GDSII description with suitable information corresponding to the described apparatus and method.

What is claimed is:

1. An apparatus comprising:
    a set of logic blocks configured to perform designated data processing functions;
    a set of redundant logic blocks also configured to perform the designated data processing functions;
    a logic block selector module to replace one or more of the set of logic blocks with one or more of the set of redundant logic blocks according to specified logic block replacement conditions, wherein, to replace the one or more of the logic blocks with one or more of the redundant logic blocks, the logic block selector module assigns an ID code to the redundant logic blocks which is equivalent to the ID code of the logic blocks to be replaced;
    a plurality of buses, wherein each bus of the plurality of buses is allocated to an individual logic block; and
    a multiplexer having an input and an output, wherein the plurality of buses utilized by the logic blocks are provided at the input of the multiplexer and wherein the output of the multiplexer is coupled to a bus input of one of the redundant logic blocks, and wherein responsive to a selection signal, the multiplexer communicatively couples one of the plurality of buses to the bus input of the redundant logic block.

2. The apparatus as in claim 1 wherein one of the specified logic block replacement conditions comprises detecting that the one or more of the set of logic blocks are malfunctioning.

3. The apparatus as in claim 1 wherein the logic block selector module comprises:
    a bank of fuses to generate an ID code for one or more of the set of redundant logic blocks when selected fuses are blown.

4. The apparatus as in claim 1 wherein the selection signal is generated by the logic block selector module and identifies a logic block that is to be replaced by the redundant logic block.

5. The apparatus as in claim 1 wherein the logic block selector module comprises:
    a memory for storing an ID code for one or more of the set of redundant logic blocks.

6. The apparatus as in claim 5 wherein the memory comprises a non-volatile memory.

7. The apparatus as in claim 1 wherein the logic block selector module comprises:
   a jumper for selecting an ID code for one or more of the set of redundant logic blocks.

8. The apparatus as in claim 1 further comprising:
   test logic for automatically testing each of the logic blocks and providing the results of the tests to the logic block selector module, wherein the specified logic block replacement conditions include an indication, according to the tests, that one or more of the logic blocks are damaged.

9. A method for repairing an integrated circuit ("IC") comprising:
   testing logic blocks within a first set of logic blocks on the IC to determine whether any of the first set of logic blocks are damaged, each of the logic blocks within the first set having an ID code associated therewith;
   identifying a damaged logic block within the first set;
   replacing the damaged logic block with a redundant logic block on the IC;
   assigning the ID code associated with the damaged logic block to the redundant logic block;
   disabling the damaged logic block upon detecting that the ID code associated with the damaged logic block is assigned to the redundant logic block; and
   disabling a clock signal provided to the damaged logic block.

10. A machine-readable medium having code stored thereon which defines an integrated circuit (IC), said IC comprising:
    set of logic blocks configured to perform designated data processing functions;
    a set of redundant logic blocks also configured to perform the designated data processing functions;
    a logic block selector module to replace one or more of the set of logic blocks with one or more of the set of redundant logic blocks according to specified logic block replacement conditions, wherein, to replace the one or more of the logic blocks with one or more of the redundant logic blocks, the logic block selector module assigns an ID code to the redundant logic blocks which is equivalent to the ID code of the logic blocks to be replaced;
    a plurality of buses, wherein each bus of the plurality of buses is allocated to an individual logic block; and
    a multiplexer having an input and an output, wherein the plurality of buses utilized by the logic blocks are provided at the input of the multiplexer and wherein the output of the multiplexer is coupled to a bus input of one of the redundant logic blocks, and wherein responsive to a selection signal, the multiplexer communicatively couples one of the plurality of buses to the bus input of the redundant logic block.

11. The machine readable medium as in claim 10 wherein one of the specified logic block replacement conditions comprises detecting that the one or more of the set of logic blocks are malfunctioning.

12. The machine readable medium as in claim 10 wherein the logic block selector module comprises:
    a bank of fuses to generate an ID code for one or more of the set of redundant logic blocks when selected fuses are blown.

13. The machine readable medium as in claim 10, wherein the selection signal is generated by the logic block selector module and identifies a logic block that is to be replaced by the redundant logic block.

14. The machine readable medium as in claim 10 wherein the logic block selector module comprises:
    a memory for storing an ID code for one or more of the set of redundant logic blocks.

15. The machine readable medium as in claim 14 wherein the memory comprises a non-volatile memory.

16. The machine readable medium as in claim 10 wherein the logic block selector module comprises:
    a jumper for selecting an ID code for one or more of the set of redundant logic blocks.

17. The machine readable medium as in claim 10 having code stored thereon which defines an integrated circuit (IC), said IC further comprising:
    test logic for automatically testing each of the logic blocks and providing the results of the tests to the logic block selector module, wherein the specified logic block replacement conditions include an indication, according to the tests, that one or more of the logic blocks are damaged.

18. The machine readable medium as in claim 10 wherein the logic block to be replaced comprises:
    a logic block disable module to disable the logic block to be replaced upon detecting that the ID code of the logic block has been assigned to the redundant logic block.

19. The machine readable medium as in claim 18 having code stored thereon which defines an integrated circuit (IC), said IC further comprising:
    a comparator to compare the ID code assigned to the redundant logic block with the ID code of the logic block to be replaced, the comparator generating a disable signal interpretable by the logic block disable module upon detecting that the ID code of the logic block to be replaced is equal to the ID code assigned to the redundant logic block.

20. An apparatus comprising:
    a plurality of logic blocks on an integrated circuit, each of the plurality of logic blocks performing specified data processing functions;
    a logic block selector to generate a binary code indicating a first subset of the plurality of logic blocks which are to be enabled and a second subset of the plurality of logic blocks which are to be enabled based on test results from tests performed on each of the plurality of logic blocks, the tests indicating which, if any of the logic blocks are damaged, wherein the logic block selector does not enable logic blocks which are damaged.

21. The apparatus as in claim 20 wherein the logic block selector comprises a plurality of binary storage elements for storing the binary code.

22. The apparatus as in claim 21 wherein the binary storage elements comprise a plurality of fuses, the binary code being generated based on which of the plurality of fuses are blown.

23. The apparatus as in claim 21 wherein the binary storage elements comprise a non-volatile memory device.

24. The apparatus as in claim 20 further comprising:
    one or more multiplexers to electrically couple communication buses to the logic blocks within the first set of logic blocks.

25. The apparatus as in claim 24 wherein the multiplexers comprise a first set of multiplexers to electrically couple input buses to each of the logic blocks within the first set and a second set of multiplexers to electrically couple output buses to each of the logic blocks within the first set.

26. The apparatus as in claim 25 wherein the multiplexers are controlled by the binary code generated by the logic block selector.

27. An apparatus comprising:
   a set of logic blocks configured to perform designated data processing functions;
   a set of redundant logic blocks also configured to perform the designated data processing functions; and
   a logic block selector module to replace one or more of the set of logic blocks with one or more of the set of redundant logic blocks according to specified logic block replacement conditions, wherein, to replace the one or more of the logic blocks with one or more of the redundant logic blocks, the logic block selector module assigns an ID code to the redundant logic blocks which is equivalent to the ID code of the logic blocks to be replaced; and
   a logic block disable module to disable the logic block to be replaced upon detecting that the ID code of the logic block has been assigned to the redundant logic block.

28. The apparatus as in claim 27 further comprising:
   a comparator to compare the ID code assigned to the redundant logic block with the ID code of the logic block to be replaced, the comparator generating a disable signal interpretable by the logic block disable module upon detecting that the ID code of the logic block to be replaced is equal to the ID code assigned to the redundant logic block.

29. A method for repairing an integrated circuit ("IC") comprising:
   testing logic blocks within a first set of logic blocks on the IC to determine whether any of the first set of logic blocks are damaged, each of the logic blocks within the first set having an ID code associated therewith;
   identifying a damaged logic block within the first set;
   replacing the damaged logic block with a redundant logic block on the IC;
   assigning the ID code associated with the damaged logic block to the redundant logic block;
   disabling the damaged logic block upon detecting that the ID code associated with the damaged logic block is assigned to the redundant logic block; and
   providing the ID code assigned to the redundant logic block and the ID code of the damaged logic block to a comparator, the comparator generating a disable signal to disable the damaged logic if the ID codes are equal.

30. A method for repairing an integrated circuit ("IC") comprising:
   testing logic blocks within a first set of logic blocks on the IC to determine whether any of the first set of logic blocks are damaged, each of the logic blocks within the first set having an ID code associated therewith;
   identifying a damaged logic block within the first set;
   replacing the damaged logic block with a redundant logic block on the IC;
   assigning the ID code associated with the damaged logic block to the redundant logic block;
   disabling the damaged logic block upon detecting that the ID code associated with the damaged logic block is assigned to the redundant logic block; and
   re-mapping a bus used by the damaged logic block to the redundant logic block,
   wherein re-mapping comprises providing the ID code of the damaged logic block as a select signal to a multiplexer, the output of the multiplexer coupled to the input of the redundant logic block and the input of the multiplexer including the bus used by the damaged logic block, the multiplexer coupling the bus to its output in response to the select signal.

31. An apparatus comprising:
   a plurality of logic blocks on an integrated circuit, each of the plurality of logic blocks performing specified data processing functions;
   a logic block selector to generate a binary code indicating a first subset of the plurality of logic blocks which are to be enabled and a second subset of the plurality of logic blocks which are to be enabled based on test results from tests performed on each of the plurality of logic blocks, the tests indicating which, if any of the logic blocks are damaged, wherein the logic block selector does not enable certain logic blocks which are undamaged so that the total number of enabled logic blocks is equal to a specified number.

* * * * *